(12) United States Patent
Dix et al.

(10) Patent No.: US 10,217,810 B2
(45) Date of Patent: Feb. 26, 2019

(54) CAPACITOR FORMED ON HEAVILY DOPED SUBSTRATE

(71) Applicant: Microchip Technology Incorporated, Chandler, AZ (US)

(72) Inventors: Greg Dix, Tempe, AZ (US); Randy Yach, Phoenix, AZ (US); Francesco Mazzilli, Renens (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/347,213

(22) Filed: Nov. 9, 2016

(65) Prior Publication Data

US 2017/0162648 A1 Jun. 8, 2017

Related U.S. Application Data

(60) Provisional application No. 62/264,071, filed on Dec. 7, 2015.

(51) Int. Cl.
*H01L 49/02* (2006.01)
*H01L 21/311* (2006.01)
(Continued)

(52) U.S. Cl.
CPC ........ *H01L 28/60* (2013.01); *H01L 21/31105* (2013.01); *H01L 21/52* (2013.01); *H01L 23/3142* (2013.01); *H01L 23/48* (2013.01); *H01L 23/5222* (2013.01); *H01L 23/5223* (2013.01); *H01L 24/10* (2013.01); *H01L 24/14* (2013.01); *H01L 24/42* (2013.01); *H01L 24/85* (2013.01); *H01L 25/0652* (2013.01); *H01L 28/00* (2013.01); *H01L 28/40* (2013.01); *H01L 24/03* (2013.01); *H01L 24/05* (2013.01); *H01L 24/11* (2013.01); *H01L 24/13* (2013.01);
(Continued)

(58) Field of Classification Search
CPC ..... H01L 28/60; H01L 21/31105; H01L 28/40
See application file for complete search history.

(56) References Cited

U.S. PATENT DOCUMENTS

| | | | | |
|---|---|---|---|---|
| 5,225,286 A | * | 7/1993 | Fujikawa | H01L 28/40 174/250 |
| 2003/0030125 A1 | * | 2/2003 | Goldberger | H01L 27/0255 257/532 |

(Continued)

FOREIGN PATENT DOCUMENTS

WO 2012/177934 A2 12/2012 ............ H01L 27/06

OTHER PUBLICATIONS

International Search Report and Written Opinion, Application No. PCT/US2016/065246, 11 pages, dated Mar. 17, 2017.

*Primary Examiner* — Wael M Fahmy
*Assistant Examiner* — Sarah K Salerno
(74) *Attorney, Agent, or Firm* — Slayden Grubert Beard PLLC

(57) ABSTRACT

The teachings of the present disclosure may be applied to the manufacture and design of capacitors. In some embodiments of these teachings, a capacitor may be formed on a heavily doped substrate. For example, a method for manufacturing a capacitor may include: depositing an oxide layer on a first side of a heavily doped substrate; depositing a first metal layer on the oxide layer; and depositing a second metal layer on a second side of the heavily doped substrate.

18 Claims, 5 Drawing Sheets

(51) Int. Cl.
  *H01L 21/52* (2006.01)
  *H01L 23/31* (2006.01)
  *H01L 23/00* (2006.01)
  *H01L 23/48* (2006.01)
  *H01L 23/522* (2006.01)
  *H01L 25/065* (2006.01)

(52) U.S. Cl.
  CPC .............. *H01L 24/16* (2013.01); *H01L 24/29* (2013.01); *H01L 24/32* (2013.01); *H01L 24/48* (2013.01); *H01L 24/81* (2013.01); *H01L 24/83* (2013.01); *H01L 2224/0391* (2013.01); *H01L 2224/0401* (2013.01); *H01L 2224/04026* (2013.01); *H01L 2224/04042* (2013.01); *H01L 2224/131* (2013.01); *H01L 2224/13022* (2013.01); *H01L 2224/1412* (2013.01); *H01L 2224/14104* (2013.01); *H01L 2224/16145* (2013.01); *H01L 2224/293* (2013.01); *H01L 2224/2929* (2013.01); *H01L 2224/32145* (2013.01); *H01L 2224/48101* (2013.01); *H01L 2224/48105* (2013.01); *H01L 2224/48137* (2013.01); *H01L 2224/49175* (2013.01); *H01L 2224/73257* (2013.01); *H01L 2224/73265* (2013.01); *H01L 2224/8192* (2013.01); *H01L 2224/81815* (2013.01); *H01L 2924/00014* (2013.01); *H01L 2924/1205* (2013.01)

(56) References Cited

U.S. PATENT DOCUMENTS

| | | | |
|---|---|---|---|
| 2008/0108202 A1* | 5/2008 | Goldberger | H01G 4/33 438/393 |
| 2008/0149981 A1 | 6/2008 | Lamey et al. | 257/306 |
| 2008/0237790 A1 | 10/2008 | Yabuzaki et al. | 257/531 |
| 2012/0012982 A1* | 1/2012 | Korec | H01L 29/66181 257/533 |
| 2013/0026658 A1* | 1/2013 | Chen | H01L 24/05 257/784 |
| 2015/0145104 A1 | 5/2015 | Bauer et al. | 257/534 |

* cited by examiner

CAPACITOR FORMED ON HEAVILY DOPED SUBSTRATE

CROSS-REFERENCE TO RELATED APPLICATION

This application claims priority to commonly owned U.S. Provisional Patent Application No. 62/264,071 filed Dec. 7, 2015, which is hereby incorporated by reference herein for all purposes.

TECHNICAL FIELD

The present disclosure relates to semiconductor manufacturing in general. The teachings thereof may be applied to capacitors formed on a heavily doped substrate.

BACKGROUND

Some integrated circuit (IC) devices include one or more dies manufactured on a substrate. The substrate typically comprises one or more semiconductor materials. In IC devices that comprise multiple transceivers and/or transmitter/receiver pairs, the transceivers must typically be electrically isolated from one another.

In semiconductor production, "doping" refers to the intentional introduction of impurities into a semiconductor material. Such impurities modulate the electrical properties of the semiconductor. In general, an increase in dopant concentration leads to an increase in conductivity.

In practice, an "intrinsic" semiconductor may refer to a rather pure semiconductor material. An "extrinsic" semiconductor may refer to a lightly or moderately doped semiconductor. A "degenerate" semiconductor may refer to a semiconductor so highly doped that it appears to be a conductor rather than a semiconductor. Such degenerate semiconductors may be used in place of metal materials in modern IC devices. As an example, silicon may be considered degenerate at room temperature when doped at concentrations above about $10^{18}$ cm$^{-3}$ and/or a proportion of impurity to silicon on the order of parts per thousand.

SUMMARY

The teachings of the present disclosure may be applied to the manufacture and design of capacitors. In some embodiments of these teachings, a capacitor may be formed on a heavily doped substrate. For example, a method for manufacturing a capacitor may include: depositing an oxide layer on a first side of a heavily doped substrate; depositing a first metal layer on the oxide layer; and depositing a second metal layer on a second side of the heavily doped substrate.

Some embodiments of the method may include depositing a passivation layer on the first metal layer and patterning and etching the passivation layer to expose a portion of the first metal layer.

Some embodiments of the method may include: depositing a passivation layer on the first metal layer; patterning and etching the passivation layer to expose a portion of the first metal layer; and depositing bumps on the exposed portion of the first metal layer to support flip-chip mounting.

In some embodiments, the oxide layer has a thickness greater than or equal to 14 µm.

Some embodiments of the method may include backgrinding the heavily doped substrate before depositing the second metal layer.

Some embodiments of the method may include sawing through the substrate, the oxide layer, the first metal layer, and the second metal layer to define a size and shape of the capacitor.

Some embodiments of the method may include: depositing a passivation layer on the first metal layer; patterning and etching the passivation layer to expose a portion of the first metal layer; and backgrinding the heavily doped substrate after patterning and etching the passivation layer and before depositing the second metal layer.

Some embodiments of the method may include: patterning and etching the first metal layer; depositing a passivation layer on the first metal layer; and patterning and etching the passivation layer to expose a portion of the first metal layer.

Some embodiments of the method may include: patterning and etching the first metal layer; depositing a passivation layer on the first metal layer; patterning and etching the passivation layer to expose a portion of the first metal layer; and depositing bumps on the exposed portion of the first metal layer to support flip-chip mounting.

As another example, a method for manufacturing a transmitter/receiver integrated circuit device may include: depositing an oxide layer on a first side of a heavily doped substrate; depositing a first metal layer on the oxide layer; depositing a second metal layer on a second side of the heavily doped substrate; connecting the first metal layer to a contact point of a first die; and connecting the second metal layer to a contact point of a second die.

In some embodiments, the first die may comprise at least one transceiver, receiver, or transmitter circuit and the second die comprises at least one transceiver, receiver, or transmitter circuit.

In some embodiments, the first metal layer is connected to the contact point of the first die by flip-chip mounting and the second metal layer is connected to the contact point of the second die by wire bonding.

In some embodiments, the first metal layer is connected to the contact point of the first die by conductive epoxy and the second metal layer is connected to the contact point of the second die by wire bonding.

As another example, a method for manufacturing a transmitter/receiver integrated circuit device may include: forming a first capacitor by: depositing an oxide layer on a first side of a heavily doped substrate; depositing a first metal layer on the oxide layer; and depositing a second metal layer on a second side of the heavily doped substrate; forming a second capacitor by repeating the deposition; connecting the first metal layer of the first capacitor to a contact point of a first die; connecting the first metal layer of the second capacitor to a contact point of a second die; and wire bonding the second metal layer of the first capacitor to the second metal layer of the second capacitor.

In some embodiments, the first die comprises at least one transceiver, receiver, or transmitter circuit and the second die comprises at least one transceiver, receiver, or transmitter circuit.

Some embodiments may include connecting the first metal layer of the first capacitor to the contact point of the first die with flip-chip mounting and connecting the first metal layer of the second capacitor to the contact point of the second die with flip-chip mounting.

Some embodiments may include connecting the first metal layer of the first capacitor to the contact point of the first die with conductive epoxy and connecting the first metal layer of the second capacitor to the contact point of the second die with conductive epoxy.

Some embodiments may include a capacitor comprising: a heavily doped substrate; an oxide layer deposited on the heavily doped substrate; a first metal layer deposited on top of the oxide layer; and a second metal layer deposited on a backside of the substrate.

In some embodiments, the oxide layer is at least 14 µm thick.

Some embodiments may include a passivation layer deposited on top of the first metal layer.

Some embodiments may include a passivation layer deposited on top of the first metal layer, the passivation layer patterned and etched to exposed a portion of the first metal layer and bumps deposited on the exposed portion of the first metal layer for flip-chip mounting.

Some embodiments may include a capacitor as described, bonded to a transmitter or a receiver chip by flip-chip bonding or conductive epoxy.

DETAILED DESCRIPTION

Figure 1:
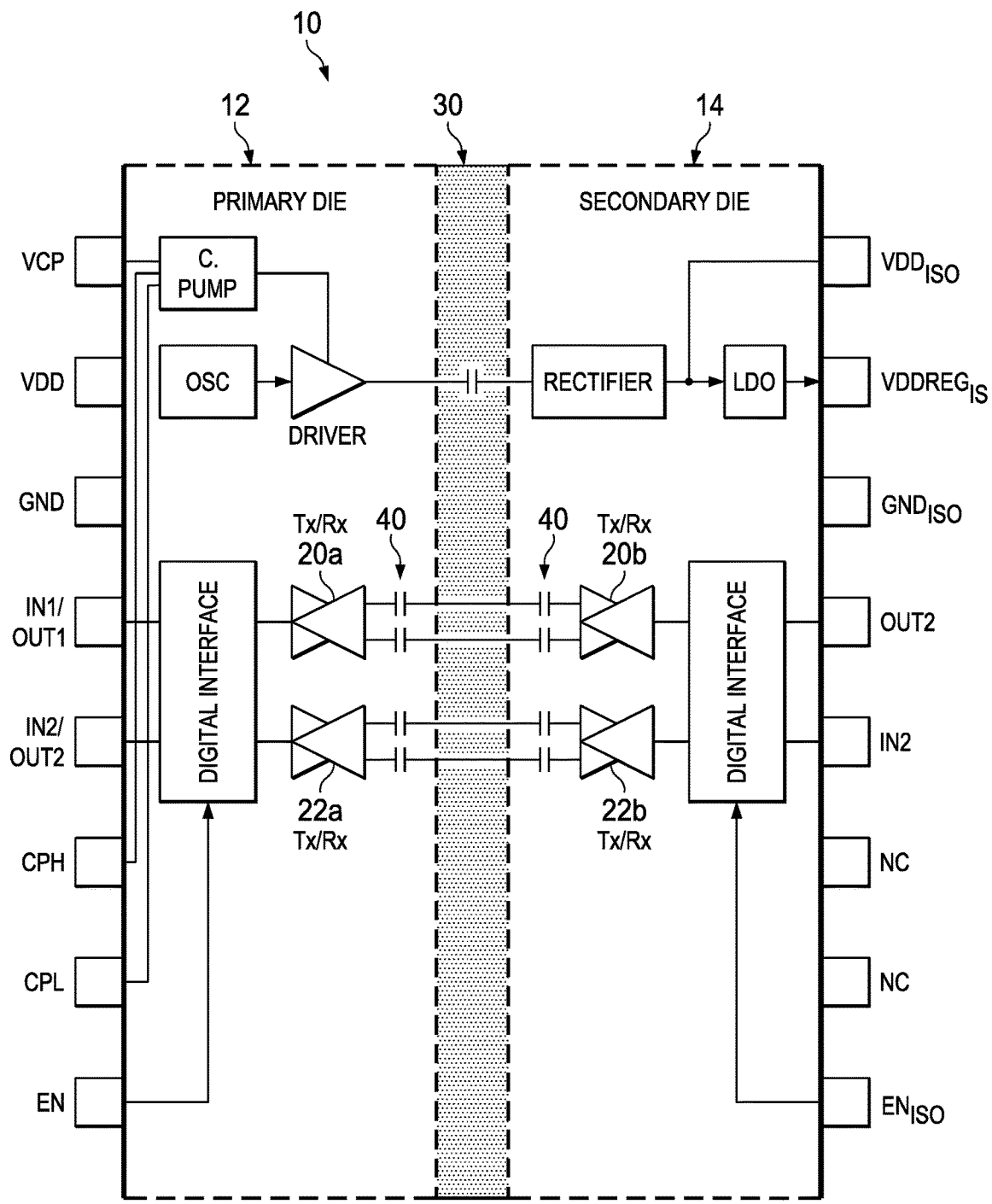
FIG. 1 is a drawing showing a prior art integrated circuit device including two transceiver pairs with associated capacitors on the same chip, separated by an isolation barrier.

In some conventional IC devices, a primary die and a secondary die are separated by an oxide layer functioning as a capacitor. An example IC device 10 with this construction is depicted in FIG. 1, including primary die 12 and secondary die 14. IC device 10 includes two transceiver pairs 20a, 20b and 22a, 22b connected across an insulation layer 30. In addition, IC device 10 includes capacitors 40 built on the primary die 12 and secondary die 14 (on-chip capacitors) along with the associated transmitter/receivers 20a, 20b, 22a, 22b.

The fabrication of IC device 10 provides up to 8 µm of oxide for use as the plate of capacitors 40. In testing, capacitors 40 broke down to the intermediate node during 6 kV testing. According to conventional techniques, this failure might be remedied by increasing the thickness of the oxide layer used to form the capacitors. In practice, however, the required thickness greatly increases the cost of fabrication and the complexity of the processing.

The teachings of the present disclosure, in contrast, provide methods for fabricating capacitors that may be used to simplify the fabrication processes and both reduce the cost of related IC devices and/or increase the reliability.

Figure 2:
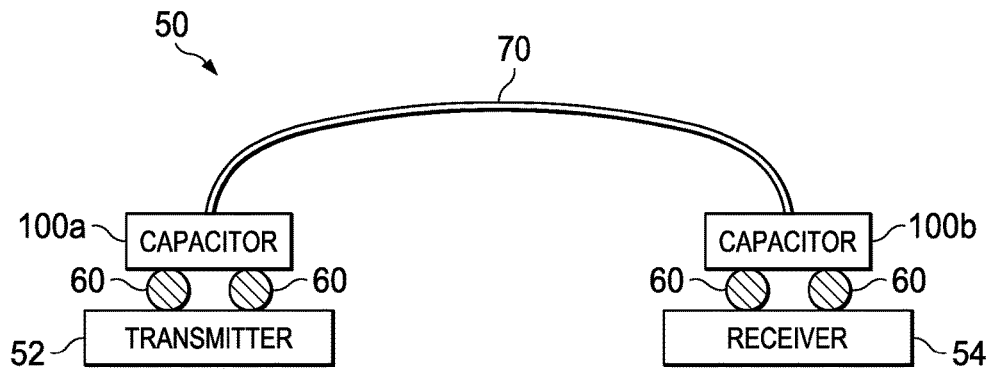
FIG. 2 is a drawing showing an example IC device with a transmitter/receiver pair with associated capacitors according to the teachings of the present disclosure.

FIG. 2 is a drawing showing an example IC device 50 including a transmitter/receiver pair with associated capacitors according to the teachings of the present disclosure.

IC device 50 includes a transmitter 52, a receiver 54, and two attached capacitors 100. The pair of attached capacitors 100a, 100b may each include a sufficiently thick oxide layer to pass a 6 kV test, or the pair may be designed to pass the test when connected together.

As shown, capacitor 100a is flip-chip mounted to transmitter 52 and capacitor 100b is flip-chip mounted to receiver 54. Flip-chip mounting may also be known as controlled collapse chip connection. Flip-chip mounting uses solder bumps 60 deposited on either a chip pad or an external component. In the example where solder bumps are on the external component, they are deposited on the top of the component. The component is then 'flipped' over onto the pad and a solder reflow process is used to complete the connection between the two, resulting in the configuration shown in FIG. 2.

In this example, capacitor 100a and capacitor 100b are connected to one another by a wire bonding process. In contrast to flip-chip bonding, wire bonding includes mounting a chip first and then completing the electrical connections by wiring pads on the chip to the printed circuit board or other circuitry. As shown, the wire bonding essentially connects one plate of capacitor 100a to a corresponding plate of capacitor 100b.

Figure 3:
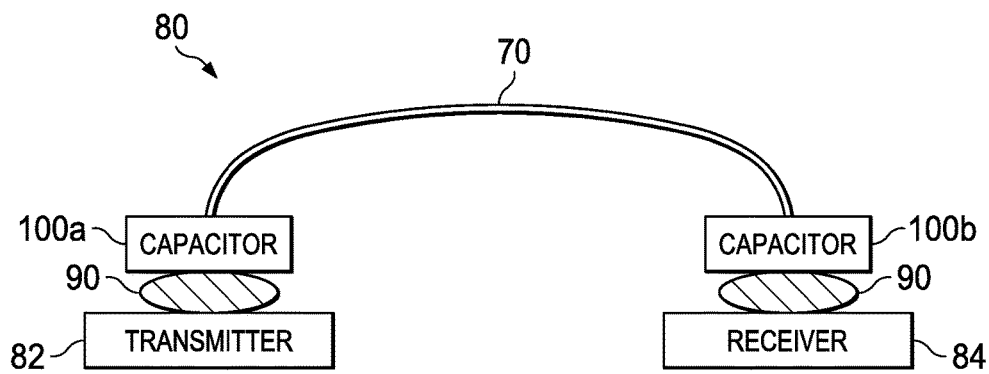
FIG. 3 is a drawing showing another example IC device incorporating the teachings of the present disclosure.

FIG. 3 is a drawing showing another example IC device 80 incorporating the teachings of the present disclosure. IC device 80 includes a transceiver 82, a receiver 84, and two attached capacitors 100a, 100b. As shown, capacitor 100a is mounted to transmitter 52 and capacitor 100b is mounted to receiver 54 using a conductive epoxy 90. In this example, capacitor 100a and capacitor 100b are connected to one another by a wire bonding process. Conductive epoxy 90 provides both a mechanical and an electrical connection between the respective IC component 82 or 84 and the capacitor 100.

Figure 4:
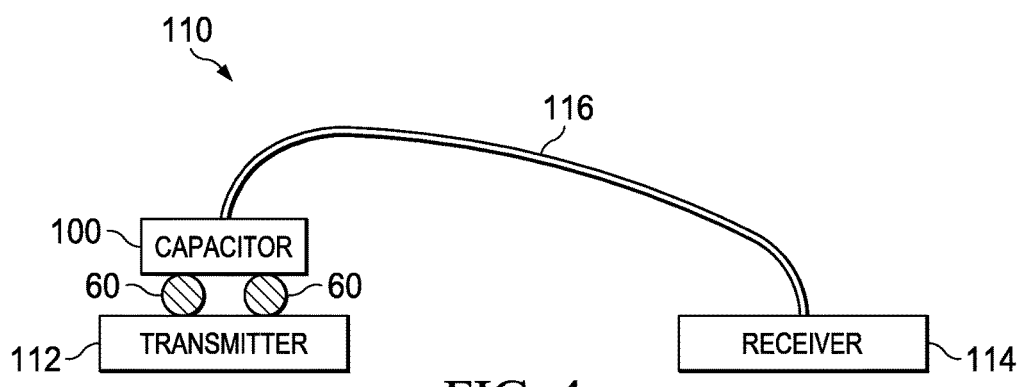
FIG. 4 is a drawing showing another example IC device incorporating the teachings of the present disclosure.

FIG. 4 is a drawing showing another example IC device 110 incorporating the teachings of the present disclosure. IC device 110 includes a transmitter 112, a receiver 114, and a single capacitor 100. A first plate of capacitor 100 is connected to transmitter 112 by flip-chip bonding with solder balls 60. A second plate of capacitor 100 is connected to receiver 114 by wire bonding. In an alternative configuration, capacitor 100 may be connected to receiver 114 by flip-chip bonding and to transceiver 112 by wire bonding.

IC device 110 may include only a single capacitor 100 in contrast to examples with two capacitors. The teachings of the present disclosure may provide capacitor 100 with sufficient durability and reliability to meet specifications previously requiring the use of a pair of capacitors.

Figure 5:
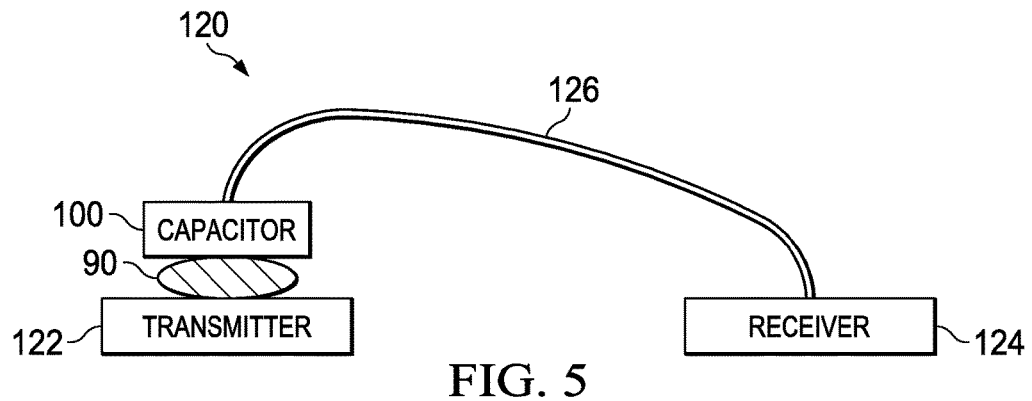
FIG. 5 is a drawing showing another example IC device 120 incorporating the teachings of the present disclosure.

FIG. 5 is a drawing showing another example IC device 120 incorporating the teachings of the present disclosure. IC device 120 includes a transmitter 122, a receiver 124, and a single capacitor 100. A first plate of capacitor 100 is connected to transmitter 122 by a conductive epoxy 90. A second plate of capacitor 100 is connected to receiver 124 by wire bonding. In an alternative configuration, capacitor 100 may be connected to receiver 124 by conductive epoxy 90 and to transceiver 122 by wire bonding.

Figure 6:
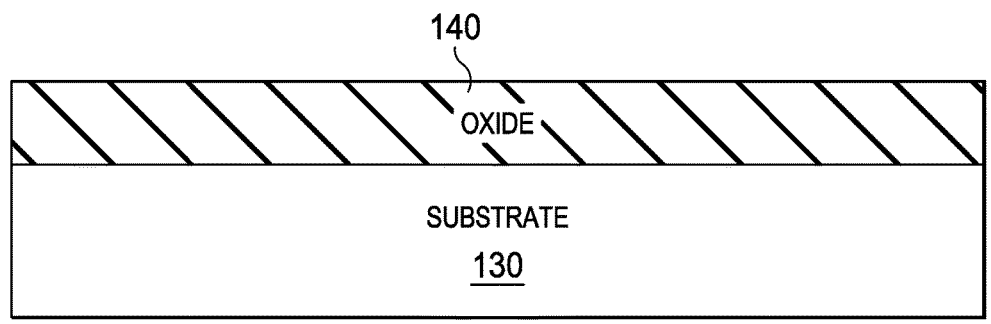
FIGS. 6-8 are drawings illustrating various steps that may be included in methods for manufacturing capacitor 100 according to the teachings of the present disclosure.
Figure 7:
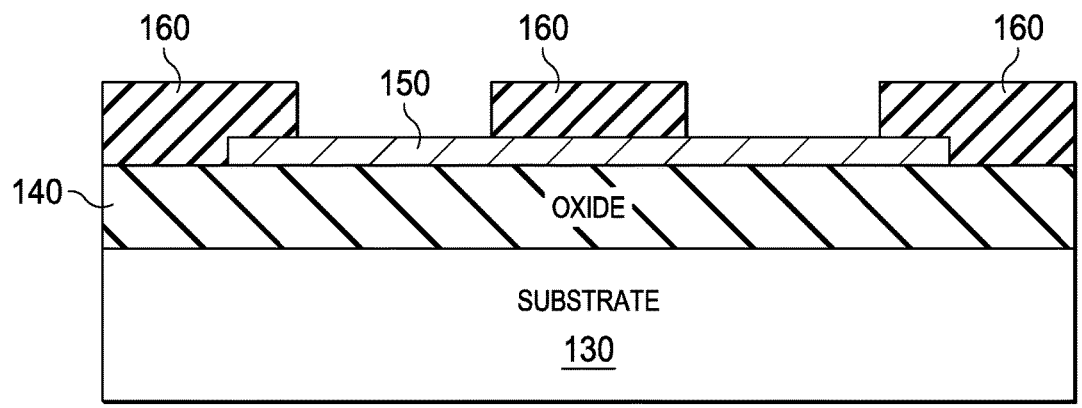
Figure 8:
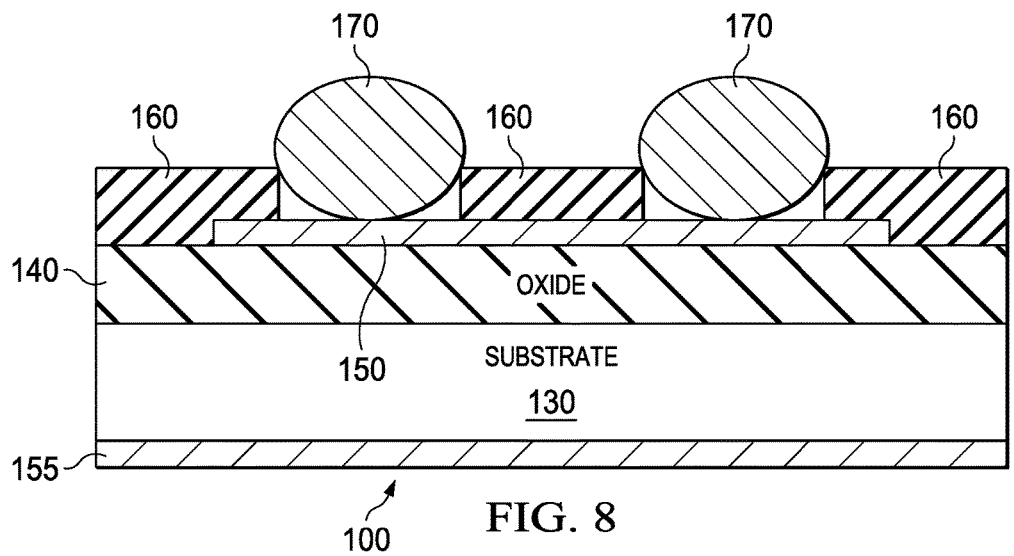

FIGS. 6-8 are drawings illustrating various steps that may be included in a method for manufacturing capacitor 100 according to the teachings of the present disclosure. As shown in FIG. 6, the method may begin with depositing an oxide layer 140 on a heavily doped or degenerate substrate 130. Degenerate substrate 130 may include n-doped silicon with a resistivity in the range of approximately 5 mOhm. com (milliohm centimeters). The oxide layer 140 may include at least 14 μm of an oxide (e.g., silicon dioxide) and may be deposited by any appropriate method (e.g., LPCVD, APCVD, other CVD processes, etc.).

FIG. 7 is a drawing showing another stage for fabricating capacitor 100 according to teachings of the present disclosure. A layer of metal 150 is deposited on the oxide layer 140. Metal layer 150 may be deposited by sputtering, CVD, or any appropriate fabrication process known in the art. Metal layer 150 may be patterned and etched as desired for the functions of capacitor 100. In some embodiments of capacitor 100, a layer of passivation material 160 may be deposited on top of metal layer 150. As shown in FIG. 7, passivation layer 160 has been patterned and etched to reveal portions of metal layer 150 for later connection steps.

FIG. 8 is a drawing showing an example capacitor 100 prepared for flip-chip mounting to an IC component according to teachings of the present disclosure. Capacitor 100 includes a second metal layer 155 deposited on the backside of the substrate 130. In some embodiments, fabrication of capacitor 100 may include backgrinding the stack (grinding the other side of substrate 130) before depositing the second metal layer 155. In some embodiments, metal layer 150 and metal layer 155 may comprise the same metallic materials. In other embodiments, metal layer 150 and metal layer 155 may comprise various materials and/or alloys as appropriate for the desired electrical characteristics of capacitor 100. Capacitor 100 now includes two metal plates, layer 150 and layer 155, separated by the oxide layer 140 and the degenerate substrate 130. Because the substrate is heavily doped, the dielectric characteristics of the oxide will dominate the performance characteristics of capacitor 100.

FIG. 8 also shows solder balls 170 deposited on the exposed portions of metal layer 150. Solder balls 170 allow implementation of flip-chip mounting for capacitor 100. For example, capacitor 100 may be flip-chip mounted to a transceiver or a receiver as shown in FIGS. 2 and 4.

Figure 9:
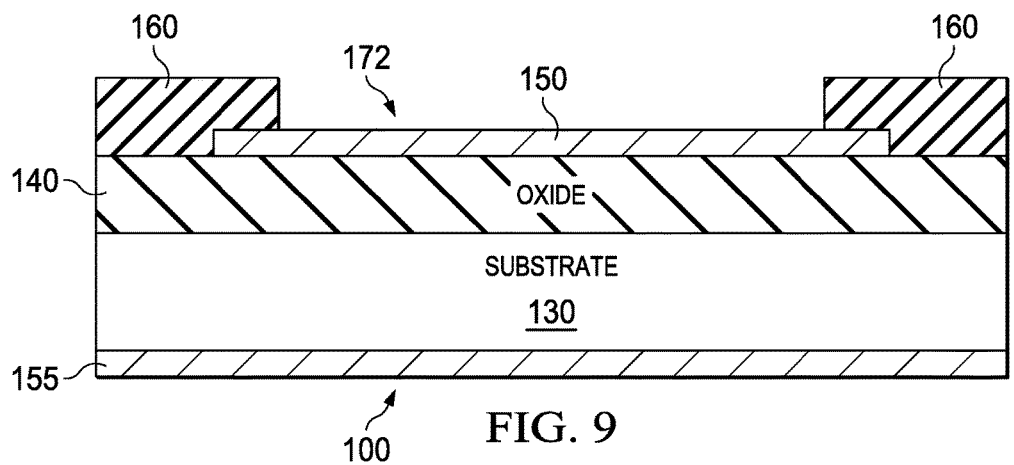
FIGS. 9 and 10 are drawings illustrating various steps that may be included in methods for manufacturing capacitor 100 according to the teachings of the present disclosure.

FIG. 9 is a drawing showing an example capacitor 100 prepared for mounting by conductive epoxy according to teachings of the present disclosure. As discussed above, capacitor 100 may include a degenerate substrate 130, an oxide layer 140, a first metal layer 150, a second metal layer 155, and a passivation layer 160. In contrast to the embodiment shown in FIG. 8, however, a different pattern has been etched in the passivation layer 160. Rather than the solder balls 170 used for flip-chip mounting, a larger portion 172 of first metal layer 150 is exposed. A conductive epoxy such as that described above may be used to connect the portion 172 of first metal layer 150 to a pad or other connection point of an associated IC die or component. In some embodiments, a wire bonding process may be used to connect to the exposed portion 172 of first metal layer 150.

Figure 10:
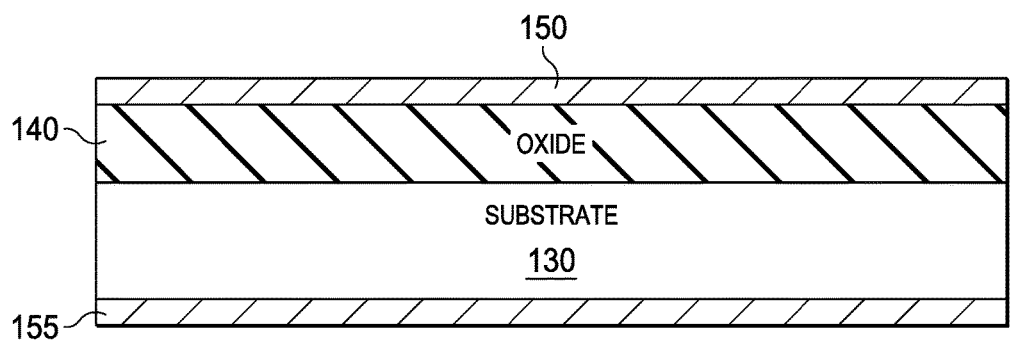

FIG. 10 is a drawing showing an example capacitor 100 according to teachings of the present disclosure. As discussed above, capacitor 100 may include a degenerate substrate 130, an oxide layer 140, a first metal layer 150, and a second metal layer 155. In contrast to the embodiments shown in FIGS. 8 and 9, however, there is no passivation layer 160. The entirety of both first metal layer 150 and second metal layer 155 is exposed. In embodiments such as that shown in FIG. 10, capacitor 100 may be called a stand-alone capacitor.

When capacitor 100 is a stand-alone capacitor, either a conductive epoxy or a wire bonding process such as that described above may be used to connect the two metal layers 150, 155 to a pad or other connection point of an associated IC die or component. In the example capacitor 100 shown in FIG. 10, a wafer sawing process may be used to define the shape and/or size of the metal layers and, therefore, the electrical properties of capacitor 100. Including such a wafer sawing process may reduce the number of processes requiring semiconductor fabrication techniques, complexity, and/or costs of manufacturing capacitor 100.

Figure 11:
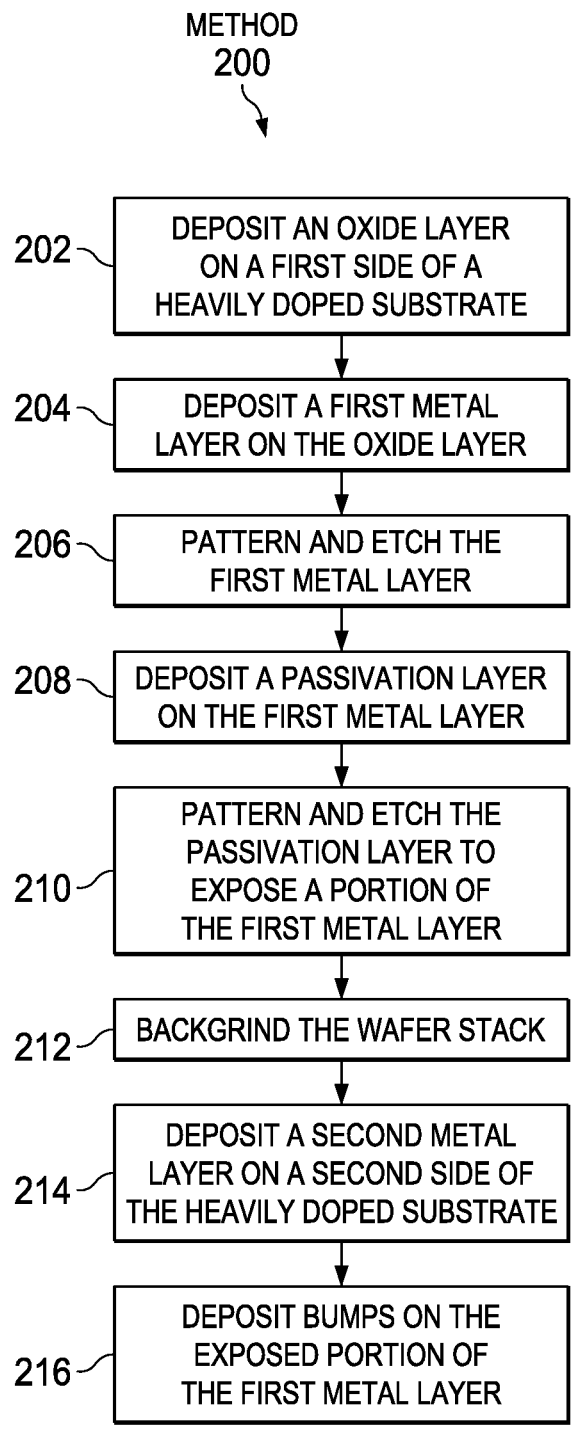
FIG. 11 is a flowchart illustrating an example method for manufacturing a capacitor incorporating teachings of the present disclosure.

FIG. 11 is a flowchart illustrating an example method 200 for manufacturing a capacitor 100 incorporating teachings of the present disclosure. Method 200 may include various alternative steps allowing for capacitor 100 to be mounted by flip-chip mounting, wire bonding, and/or conductive epoxy mounting.

Step 202 may include depositing an oxide layer on a heavily doped substrate. As described above, the heavily doped substrate may include a degenerate semiconductor. The oxide layer may include silicon dioxide or another appropriate material for forming the dielectric of a capacitor.

Step 204 may include depositing a first metal layer on the oxide layer. As described above, the metal layer may be deposited by sputtering, CVD, or any other appropriate process for the metal chosen. The metal layer may comprise any metal, alloy, or other material selected for the desired electrical properties of the capacitor.

Method 200 may include Step 206. Step 206 includes patterning and etching the first metal layer. In embodiments comprising a stand-alone capacitor, there may be no need to pattern or etch the first metal layer. In such embodiments, method 200 may skip to Step 212 or step 214.

Step 208 may include depositing a passivation layer on top of the first metal layer. The passivation layer may be used to restrict the connections between the first metal layer and any other component, by limiting leakage and/or the potential for short circuit connections.

Step 210 may include patterning and etching the passivation layer to expose a portion of the first metal layer. The exposed portion may be shaped and/or designed to accommodate flip-chip mounting, mounting with conductive epoxy, and/or any other desired connection method.

Step 212 may include backgrinding the wafer stack. Grinding the other side of the heavily doped substrate may prepare the substrate for Step 214 by improving the flatness, dimensions, and/or other characteristics of the substrate.

Step 214 may include depositing a second metal layer on a second side of the heavily doped substrate. The material of the second metal layer may match that chosen for the first metal layer, but may also be varied for the desired electrical performance characteristics of the capacitor.

Some embodiments of Method 200 may include Step 216, deposit bumps on the exposed portion of the first metal layer. The bumps may comprise solder for use in flip-chip mounting methods as described above. Example methods to fabricate a stand-alone capacitor will not include Step 216. In addition, example methods to fabricate a capacitor to be mounted by conductive epoxy may not include Step 216.

Step 218 may include sawing the resulting stack, including the degenerate substrate, the first and second metal layers to the shape and/or size desired for a stand-alone capacitor. Methods including Step 218 may reduce the total number of semiconductor fabrication steps, thereby reducing cost, time, and/or improving reliability of the manufacturing processes.

The invention claimed is:
1. A method for manufacturing a capacitor, the method comprising:
depositing an oxide layer on a first side of a heavily doped substrate, wherein the oxide layer has a thickness of at least 14 µm to provide a break down voltage above at least 6 kV;
depositing a first metal layer on the oxide layer; and
depositing a second metal layer on a second side of the heavily doped substrate so that the first metal layer and the second metal layer are physically separated at all points by the oxide layer; and
providing a first electrode connection to the first metal layer on the first side of the substrate and a second electrode connection to the second metal layer on the second side of the substrate.
2. A method according to claim 1, further comprising:
depositing a passivation layer on the first metal layer; and
patterning and etching the passivation layer to expose a portion of the first metal layer.
3. A method according to claim 1, further comprising:
depositing a passivation layer on the first metal layer;
patterning and etching the passivation layer to expose a portion of the first metal layer; and
depositing bumps on the exposed portion of the first metal layer to support flip-chip mounting.
4. A method according to claim 1, further comprising backgrinding the heavily doped substrate before depositing the second metal layer.
5. A method according to claim 1, further comprising sawing through the substrate, the oxide layer, the first metal layer, and the second metal layer to define a size and shape of the capacitor.
6. A method according to claim 1, further comprising:
depositing a passivation layer on the first metal layer;
patterning and etching the passivation layer to expose a portion of the first metal layer; and
backgrinding the heavily doped substrate after patterning and etching the passivation layer and before depositing the second metal layer.
7. A method according to claim 1, further comprising:
patterning and etching the first metal layer;
depositing a passivation layer on the first metal layer; and
patterning and etching the passivation layer to expose a portion of the first metal layer.
8. A method according to claim 1, further comprising:
patterning and etching the first metal layer;
depositing a passivation layer on the first metal layer;
patterning and etching the passivation layer to expose a portion of the first metal layer; and
depositing bumps on the exposed portion of the first metal layer to support flip-chip mounting.
9. A method for manufacturing a transmitter/receiver integrated circuit device, the method comprising:
depositing an oxide layer on a first side of a heavily doped substrate, wherein the oxide layer has a thickness of at least 14 µm to provide a break down voltage above at least 6 kV;
depositing a first metal layer on the oxide layer;
depositing a second metal layer on a second side of the heavily doped substrate so that the first metal layer and the second metal layer are physically separated at all points by the oxide layer;
providing a first electrode connection to the first metal layer on the first side of the substrate and a second electrode connection to the second metal layer on the second side of the substrate;
connecting the first metal layer to a contact point of a first die; and
connecting the second metal layer to a contact point of a second die;
wherein the first die comprises at least one transceiver, receiver, or transmitter circuit; and
the second die comprises at least one transceiver, receiver, or transmitter circuit.
10. A method as recited in claim 9, wherein:
the first metal layer is connected to the contact point of the first die by flip-chip mounting; and
the second metal layer is connected to the contact point of the second die by wire bonding.
11. A method as recited in claim 9, wherein:
the first metal layer is connected to the contact point of the first die by conductive epoxy; and
the second metal layer is connected to the contact point of the second die by wire bonding.
12. A method for manufacturing a transmitter/receiver integrated circuit device, the method comprising:
forming a first capacitor by:
depositing an oxide layer on a first side of a heavily doped substrate, wherein the oxide layer has a thickness of at least 14 µm to provide a break down voltage above at least 6 kV;
depositing a first metal layer on the oxide layer; and
depositing a second metal layer on a second side of the heavily doped substrate so that the first metal layer and the second metal layer are physically separated at all points by the oxide layer;
forming a second capacitor by repeating the deposition;
providing a first electrode connection to the first metal layer on the first side of the substrate and a second electrode connection to the second metal layer on the second side of the substrate;
connecting the first metal layer of the first capacitor to a contact point of a first die;
connecting the first metal layer of the second capacitor to a contact point of a second die; and
wire bonding the second metal layer of the first capacitor to the second metal layer of the second capacitor;
wherein the first die comprises at least one transceiver, receiver, or transmitter circuit; and
the second die comprises at least one transceiver, receiver, or transmitter circuit.
13. A method as recited in claim 12, further comprising:
connecting the first metal layer of the first capacitor to the contact point of the first die with flip-chip mounting; and
connecting the first metal layer of the second capacitor to the contact point of the second die with flip-chip mounting.
14. A method as recited in claim 12, further comprising:
connecting the first metal layer of the first capacitor to the contact point of the first die with conductive epoxy; and
connecting the first metal layer of the second capacitor to the contact point of the second die with conductive epoxy.
15. A capacitor as recited in claim 13, further comprising a passivation layer deposited on top of the first metal layer.
16. A capacitor as recited in claim 13, further comprising:
a passivation layer deposited on top of the first metal layer, the passivation layer patterned and etched to exposed a portion of the first metal layer; and
bumps deposited on the exposed portion of the first metal layer for flip-chip mounting.

17. A capacitor as recited in claim 13, bonded to a transmitter or a receiver chip by flip-chip bonding or conductive epoxy.

18. A capacitor comprising:
a heavily doped substrate;
an oxide layer deposited on the heavily doped substrate, wherein the oxide layer has a thickness of at least 14 μm to provide a break down voltage above at least 6 kV;
a first metal layer deposited on top of the oxide layer;
a second metal layer deposited on a backside of the substrate so that the first metal layer and the second metal layer are physically separated at all points by the oxide layer; and
providing a first electrode connection to the first metal layer on the first side of the substrate and a second electrode connection to the second metal layer on the second side of the substrate.

\* \* \* \* \*